(12) United States Patent  
Ogawa et al.

(10) Patent No.: US 8,035,283 B2
(45) Date of Patent: Oct. 11, 2011

(54) RESONANT ACTUATOR

(75) Inventors: Hirozumi Ogawa, Yasu (JP); Shinichiro Kawada, Hikone (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 101 days.

(21) Appl. No.: 12/505,631

(22) Filed: Jul. 20, 2009

(65) Prior Publication Data

US 2009/0302961 A1    Dec. 10, 2009

Related U.S. Application Data

(63) Continuation of application No. PCT/JP2008/050113, filed on Jan. 9, 2008.

(30) Foreign Application Priority Data

Jan. 24, 2007    (JP) .................................. 2007-013716

(51) Int. Cl.
*H03H 9/125* (2006.01)

(52) U.S. Cl. ........ 310/365; 310/344; 310/348; 310/358; 331/158

(58) Field of Classification Search .................. 310/358, 310/365, 344, 348, 320, 321, 322
See application file for complete search history.

(56) References Cited

U.S. PATENT DOCUMENTS

| | | | |
|---|---|---|---|
| 6,232,699 B1 * | 5/2001 | Wajima | 310/320 |
| 6,274,964 B1 * | 8/2001 | Yoshida et al. | 310/321 |
| 6,307,305 B1 * | 10/2001 | Yoshio et al. | 310/348 |
| 6,525,449 B1 * | 2/2003 | Wajima | 310/365 |
| 6,903,489 B2 * | 6/2005 | Suzuki et al. | 310/320 |
| 2004/0214723 A1 * | 10/2004 | Nonoyama et al. | 505/100 |
| 2004/0251791 A1 * | 12/2004 | Ogawa et al. | 310/358 |
| 2009/0200900 A1 * | 8/2009 | Nakai et al. | 310/365 |

FOREIGN PATENT DOCUMENTS

| | | |
|---|---|---|
| JP | 10-245298 | 9/1998 |
| JP | 11-330897 | 11/1999 |
| JP | 2001-39766 | 2/2001 |
| JP | 2001-291908 | 10/2001 |
| JP | 2004-7406 | 1/2004 |

OTHER PUBLICATIONS

"New Development in Piezoelectric Materials"; S. Takahashi; New Ceramics, vol. 11, No. 8 (1998); pp. 29-34.

"Evaluation for High-Power Materials"; S. Takabashi, New Ceramics (1995) No. 6, Electoronic Ceramics (26)[127]; pp. 17-21.

* cited by examiner

*Primary Examiner* — Walter Benson
*Assistant Examiner* — Bryan Gordon
(74) *Attorney, Agent, or Firm* — Dickstein Shapiro LLP

(57) ABSTRACT

A piezoelectric ceramic base member is formed of a bar shaped bismuth layer compound, and has main electrodes on two end surfaces in an oscillation direction, with connection electrodes at side-surface central portions of the piezoelectric ceramic base member electrically connected to the main electrodes through extraction conductors interposed therebetween, respectively. The oscillation and polarization directions are set in the same direction, and the piezoelectric ceramic base member is driven at a resonant frequency or at a frequency in the vicinity thereof. The crystal c axis is preferably oriented in a direction orthogonal to the polarization direction. The resonant actuator is able to obtain a high oscillation speed as it has a large mechanical quality factor Qm, and the oscillation is not disturbed by mechanical factors.

20 Claims, 7 Drawing Sheets

FIG. 10
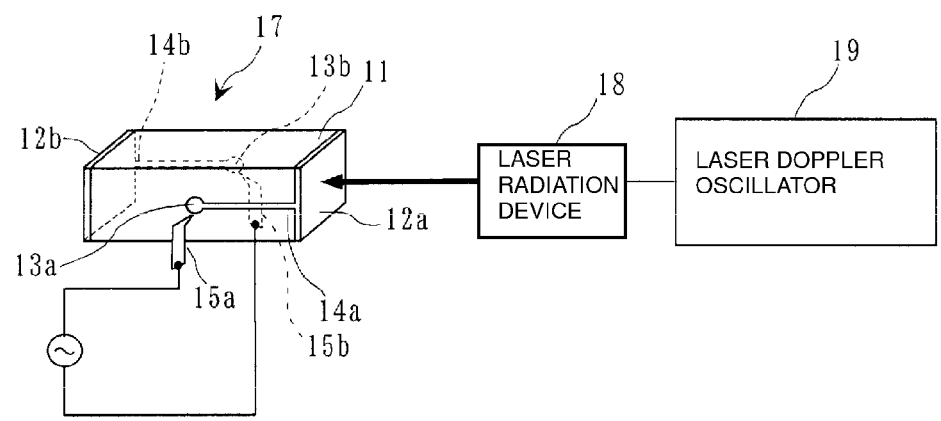
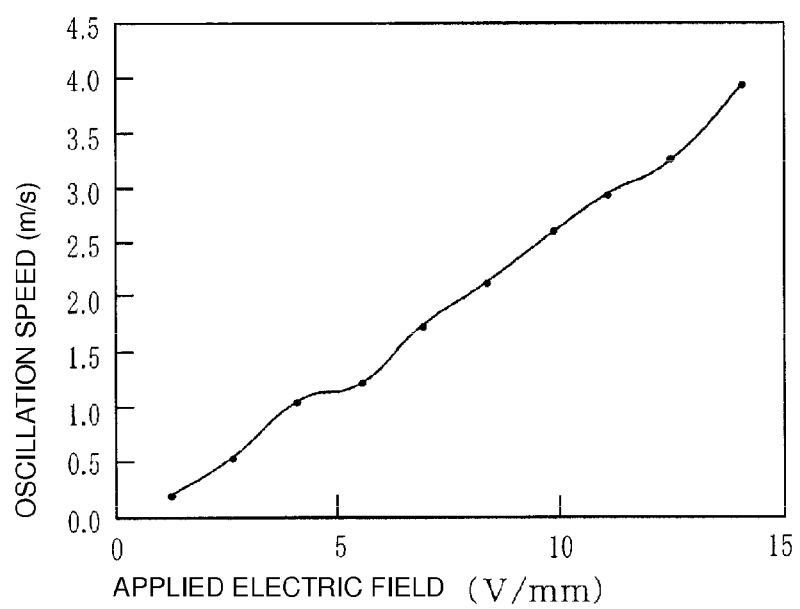
FIG. 11

PRIOR ART

RESONANT ACTUATOR

This is a continuation of application Serial No. PCT/JP2008/050113, filed Jan. 9, 2008.

TECHNICAL FIELD

The present invention relates to a resonant actuator, and more particularly relates to resonant actuator that uses a piezoelectric ceramic material.

BACKGROUND ART

Heretofore, as shown in FIG. 12, a resonant actuator has been known that includes a ceramic base member 101 formed to have a square bar shape and electrodes 102a and 102b provided on two end surfaces thereof.

This resonant actuator is polarized in the direction shown by arrow a and is driven at a resonant frequency or at a frequency in the vicinity thereof by applying an alternating electric field to the electrodes 102a and 102b so as to obtain a longitudinal oscillation in the direction of arrow b, which is the same direction as the arrow a direction. In general, the electrodes 102a and 102b and lead wires 104a and 104b are held by spring terminals 103a and 103b, respectively, or the electrodes 102a and 102b are directly connected to lead wires 104a and 104b, respectively, and an alternating electric field is applied to the electrodes 102a and 102b.

In this type of resonant actuator, it has been believed that the amount of displacement in the oscillation direction is generally proportional to the piezoelectric constant d. Accordingly, as a ceramic material for resonant actuators, research and development of a piezoelectric material primarily including $Pb(Zr,Ti)O_3$ (lead zirconate titanate; hereinafter referred to as "PZT") that has a large piezoelectric constant has heretofore been aggressively carried out.

Since power devices, such as a piezoelectric actuator, use the large-amplitude elastic oscillation of a piezoelectric ceramic, large amplitude characteristics of piezoelectric ceramics have been disclosed for example, in Non-Patent Document 1.

In this Non-Patent Document 1, it has been reported that although the oscillation speed (equal to oscillation amplitude×frequency) is theoretically changed in proportion to an applied electric field E, when a PZT-based piezoelectric ceramic is driven at a resonant frequency, and when the electric field strength exceeds a certain predetermined level, the oscillation speed is gradually decreased to less than the theoretical value and is finally saturated. In addition, the relationship between an oscillation speed limit of PZT and a driving electric field has also been disclosed in this Non-Patent Document 1, and it has been reported that although the above oscillation speed limit changes with a change in material composition, the oscillation speed of a PZT-based piezoelectric ceramic material does not exceed 1 m/s at the maximum.

Since a high-power material having a high oscillation level has been desired in the fields of a piezoelectric actuator and the like, a method for evaluating piezoelectric properties, and the relationship between the composition of a PZT-based piezoelectric ceramic and high-power characteristics, such as oscillation level characteristics, have been reported in Non-Patent Document 2.

In this Non-Patent Document 2, it has been reported that when a PZT-based piezoelectric ceramic is driven at a resonant frequency, and when the oscillation level exceeds a certain predetermined level, the resonant frequency fr and the mechanical quality factor Qm are degraded.

[Non-Patent Document 1]: Sadayuki Takahashi, "New Development of Piezoelectric Materials", TIC Corp., New Ceramics, Vol. 11, No. 8, (1988), pp. 29 to 34

[Non-Patent Document 2]: Sadayuki Takahashi, "Evaluation of High-Power Material", TIC Corp., New Ceramics, (1995), No. 6, pp. 17 to 21

DISCLOSURE OF INVENTION

Problems to be Solved by the Invention

As disclosed in Non-Patent Document 1, even if a conventional PZT-based piezoelectric ceramic is used for a resonant actuator, when a high electric field having a certain predetermined level or more is applied thereto, the oscillation speed is decreased to less than the theoretical value, becomes unstable, and finally becomes saturated.

That is, the oscillation speed is saturated when the applied electric field is increased in a resonant actuator using a PZT-based piezoelectric ceramic; hence, as a result, an oscillation speed of more than 1 m/s cannot be obtained, and thereby a resonant actuator having a large amount of displacement cannot be obtained. Furthermore, the oscillation speed in a high electric field exceeding a certain predetermined level, is not proportional to the applied electric field and is decreased to less than a theoretical value; hence, a feedback circuit for controlling the oscillation speed to a theoretical value is required, and the device may become complicated in some cases.

As disclosed in Non-Patent Document 2, it has been known that when a conventional PZT-based piezoelectric ceramic is used for a resonant actuator, the resonant frequency fr and the mechanical quality factor Qm are degraded as the oscillation speed is increased. Therefore, it is necessary to provide a feedback circuit for following the change of the resonant frequency fr. As a result, the device is complicated, the mechanical loss is increased by the decrease in mechanical quality factor Qm, and the calorific value of the piezoelectric ceramic is also increased; hence, it has been difficult to practically use this resonant actuator at a high oscillation speed.

Moreover, since the electrodes 102a and 102b are held by the spring terminals 103a and 103b or by the lead wires 104a and 104b as shown in the above FIG. 12 in a conventional resonant actuator, there has also been a problem in that these spring terminals 103a and 103b and lead wires 104a and 104b disturb the oscillation of the resonant actuator.

The present invention has been conceived in consideration of the situation as described above, and an object of the present invention is to provide a resonant actuator which is able to obtain a high oscillation speed since the mechanical quality factor Qm is high, and the oscillation of which is not disturbed by mechanical factors.

Means for Solving the Problems

In the case of a resonant actuator that is required to have a high oscillation speed, heretofore, it has been believed that a high piezoelectric constant d is important, and for this reason, only a piezoelectric ceramic material that primarily includes PZT of a high piezoelectric constant d has been investigated from a material point of view.

Through investigation of various materials carried out by the inventors of the present invention, it was found that although a bismuth layer compound has a low piezoelectric constant d compared to that of a PZT-based material, a large mechanical quality factor Qm can be obtained compared to that of the PZT-based material. In addition, it was also found that even when a high electric field having a certain predetermined level or more is applied to a bismuth layer compound, the oscillation speed can be increased approximately proportional to an applied electric field without becoming saturated.

Accordingly, when a bismuth layer compound is used as a piezoelectric ceramic material, and the electrode shape is appropriately designed so that the oscillation is not disturbed by mechanical factors, it is believed that a larger mechanical quality factor Qm can be obtained, and that thereby a high oscillation speed can be obtained in a low electric field.

The present invention was made by paying attention to the points described above, and a resonant actuator of the present invention is driven at a resonant frequency or at a frequency in the vicinity thereof and includes a ceramic base member formed to have a bar shape; and main electrodes provided on two end surfaces of the ceramic base member in an oscillation direction, in which the oscillation direction and a polarization direction are set in the same direction. In the resonant actuator described above, the ceramic base member includes a bismuth layer compound, and connection electrodes are formed at side-surface central portions of the ceramic base member and are electrically connected to the main electrodes with extraction conductors interposed therebetween.

In addition, the "side-surface central portions" not only include the central portions of side surface portions of the ceramic base member but also include portions in the vicinities thereof.

In addition, the crystal c axis is oriented in a direction orthogonal to the polarization direction in the ceramic base member of the resonant actuator according to the present invention.

The bismuth layer compound is formed of a crystalline structure including a perovskite structure between planer bismuth oxide layers. The "crystal c axis" indicates the longest axis among the crystal axes.

Advantages

According to the configuration described above, the connection electrodes are formed at the side-surface central portions that do not oscillate when the resonant actuator is driven. Hence, even when an alternating electric field is applied while the connection electrodes are held by spring terminals and/or lead wires, oscillation is prevented from being disturbed by mechanical factors. Furthermore, a bismuth layer compound has a large mechanical quality factor Qm compared to that of a PZT-based material.

Since the oscillation is prevented from being disturbed by mechanical factors, and the ceramic base member is formed of a bismuth layer compound, a larger mechanical quality factor Qm can be obtained, and a high oscillation speed can be obtained in a low electric field according to the present invention. Furthermore, the oscillation speed is approximately proportionally increased without being saturated as the applied electric field is increased and hence, a stable drive can be achieved even in a high electric field. Therefore, a feedback circuit for controlling a resonant frequency fr and an oscillation speed v is not required, so that simplification of the device, cost reduction, and miniaturization can be realized.

Furthermore, the calorific value can also be reduced, and thereby a decrease in oscillation speed caused by heat can be prevented, since a large mechanical quality factor Qm can be obtained.

In addition, since the crystal c axis of the ceramic base member is oriented in a direction orthogonal to the polarization direction, the mechanical quality factor Qm can be increased, the stably usable oscillation speed can be increased thereby, and a resonant actuator having a larger amount of displacement can be realized.

BRIEF DESCRIPTION OF DRAWINGS

FIG. 10 is a view schematically showing a measurement apparatus used in Example 2.

FIG. 11 is a view showing the relationship between an applied electric field and an oscillation speed of Sample No. 1.

Figure 1:
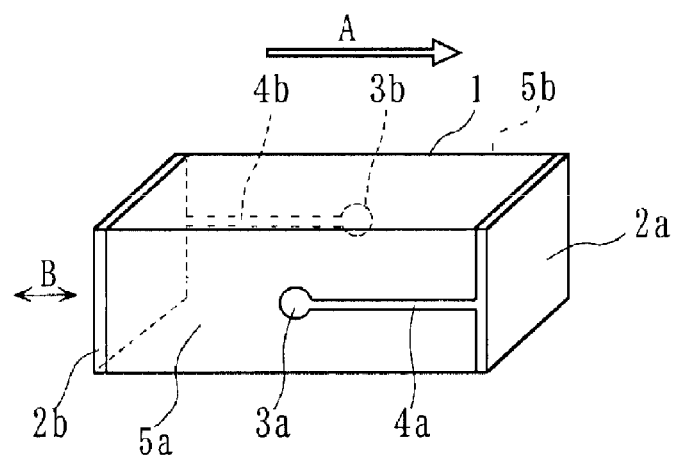
FIG. 1 is a perspective view showing one embodiment of a resonant actuator according to the present invention.

REFERENCE NUMERALS 1 piezoelectric ceramic base member
2a, 2b main electrode
3a, 3b connection electrode
4a, 4b extraction conductor
11 piezoelectric ceramic base member
12a, 12b main electrode
13a, 13b connection electrode
14a, 14b extraction conductor

BEST MODES FOR CARRYING OUT THE INVENTION

Next, an embodiment of the invention will be described in detail with reference to the drawings.

FIG. 1 is a perspective view showing one embodiment of a resonant actuator according to the present invention, and this resonant actuator includes a piezoelectric ceramic base member 1 that is formed of a bismuth layer compound, that is polarized in the direction shown by an arrow A, and that has a square bar shape, and is formed to be displaced in an arrow B direction that is parallel to the polarization direction A so as to obtain a longitudinal oscillation.

In this resonant actuator, in particular, main electrodes 2a and 2b are formed on two end surfaces of the piezoelectric ceramic base member 1 in the oscillation direction B, and connection electrodes 3a and 3b are formed at central portions (side-surface central portions) of side surface portions 5a and 5b, respectively. One main electrode 2a and one connection electrode 3a are electrically connected to each other through an extraction conductor 4a, and the other main electrode 2b and the other connection electrode 3b are also electrically connected to each other through an extraction conductor 4b. The extraction conductors 4a and 4b are formed so that the widths thereof are smaller than those of the main electrodes 2a and 2b, respectively.

When an alternating electric field having the same frequency as a resonant frequency is applied to the connection electrodes 3a and 3b, the resonant actuator is oscillated at a resonant frequency fr and is displaced in the arrow B direction, so that a resonant actuator can be obtained which has a high oscillation speed, and the oscillation of which is not disturbed by mechanical factors.

Hereinafter, the principle of the resonant actuator will be described.

Figure 2:
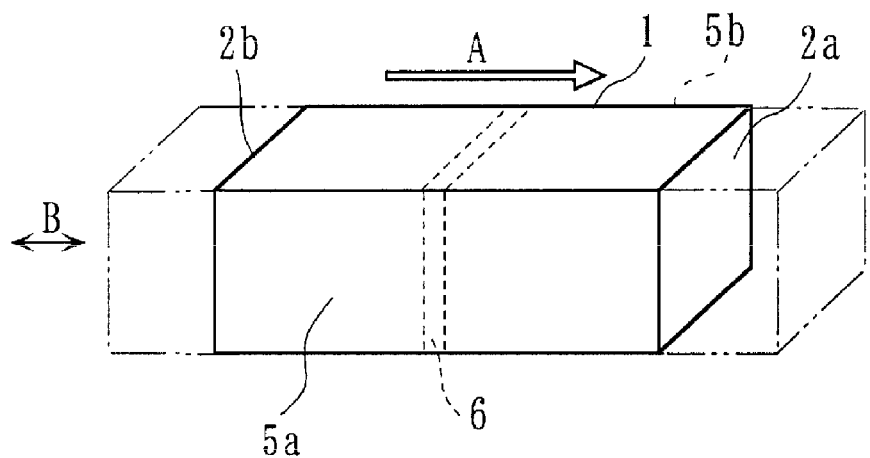
FIG. 2 is a perspective view schematically showing the state in which a piezoelectric ceramic base member is oscillated.

FIG. 2 is a view showing the state in which the piezoelectric ceramic base member 1 is oscillated in the arrow B direction. That is, when the above resonant actuator is driven, the piezoelectric ceramic base member 1 is oscillated in the arrow B direction and is displaced as shown by the imaginary lines.

Accordingly, when the main electrodes 2a and 2b are held by spring terminals and/or conductive wires in a conventional case, the oscillation of the piezoelectric ceramic base member 1 in the arrow B direction disturbs the spring terminals and/or the conductive wires, and as a result, a large amount of displacement cannot be obtained.

In addition, when the piezoelectric ceramic base member 1 is oscillated in the arrow B direction, a node portion 6 at which the oscillation is not generated is present at the side-surface central portions of this piezoelectric ceramic base member 1 so that node portion 6 does not move.

Hence, when an alternating electric field is applied while the spring terminals and/or the wires are provided at the node portion 6, the oscillation of the resonant actuator is not disturbed by mechanical factors.

In this embodiment, the electrode shape is appropriately designed so that the connection electrodes 3a and 3b are formed at the side-surface central portions corresponding to the node portion 6 and are electrically connected to the main electrodes 2a and 2b through the extraction conductors 4a and 4b, respectively.

From the results obtained through research carried out by the inventors of the present invention, it was found that when the piezoelectric ceramic base member is formed of a PZT-based material, and the electrode shape is formed as shown in FIG. 1, the longitudinal oscillation is considerably disturbed by the electric field, and the mechanical quality factor Qm is extremely degraded.

Figure 3A:
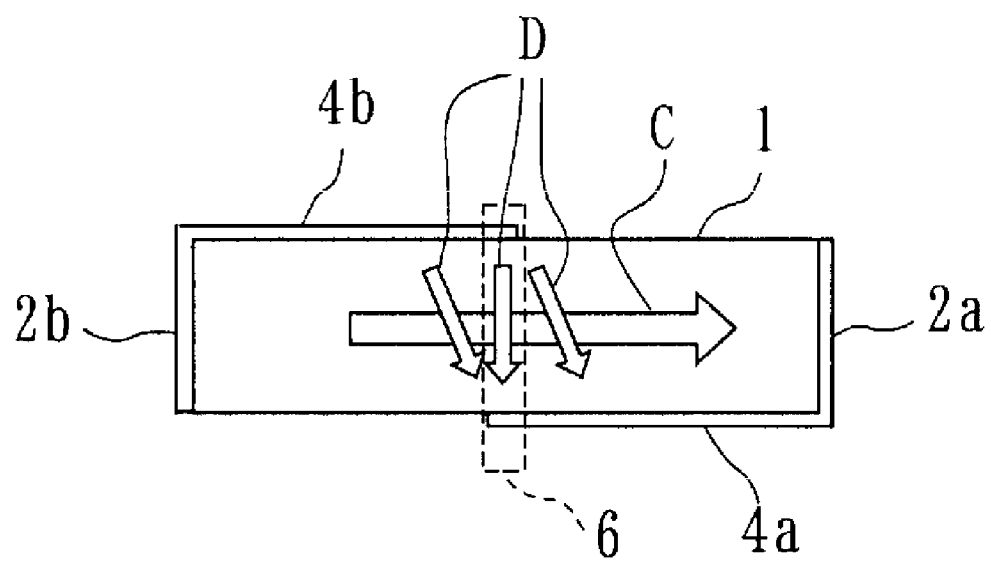
FIGS. 3A and 3B are a plan view and a front view, respectively, illustrating a problem generated when a piezoelectric ceramic base member is formed of a PZT material.
Figure 3B:
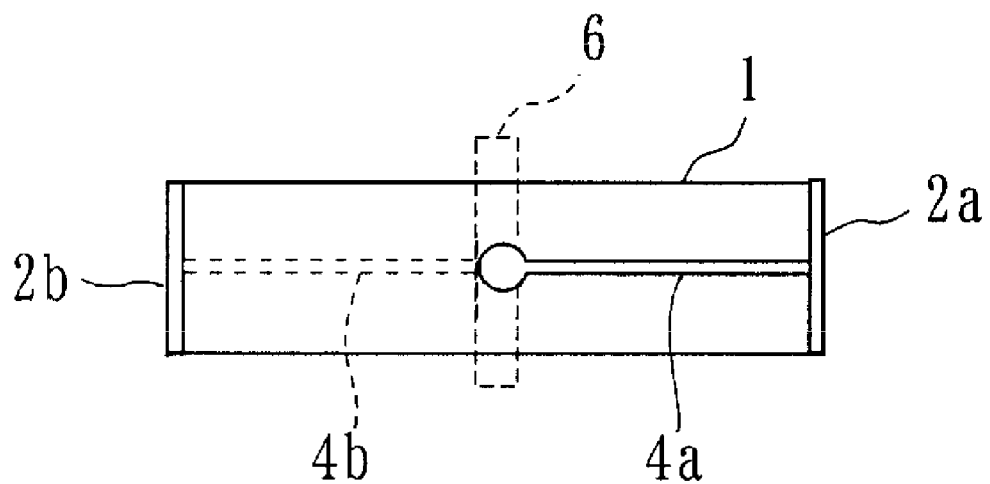

FIGS. 3A and 3B are views each showing the state of electric-field generation obtained when an alternating electric field is applied to a resonant actuator including the piezoelectric ceramic base member 1 formed of a PZT-based material; FIG. 3A is a plan view of the resonant actuator; and FIG. 3B is a front view thereof. The electrode shape is the same as that shown in FIG. 1.

In order to ensure a large amount of displacement of a resonant actuator, an electric field only in an arrow C direction is desirably generated.

However, when the piezoelectric ceramic base member 1 is formed of a PZT-based material, electric fields are also generated between the connection electrodes 3a and 3b facing each other and between the extraction conductors 4a and 4b. That is, besides the arrow C direction, electric fields are also generated in an arrow D directions (orthogonal and oblique directions with respect to the arrow C direction), and thereby the longitudinal oscillation itself is disturbed, so that the mechanical quality factor Qm is extremely decreased.

Figure 12:
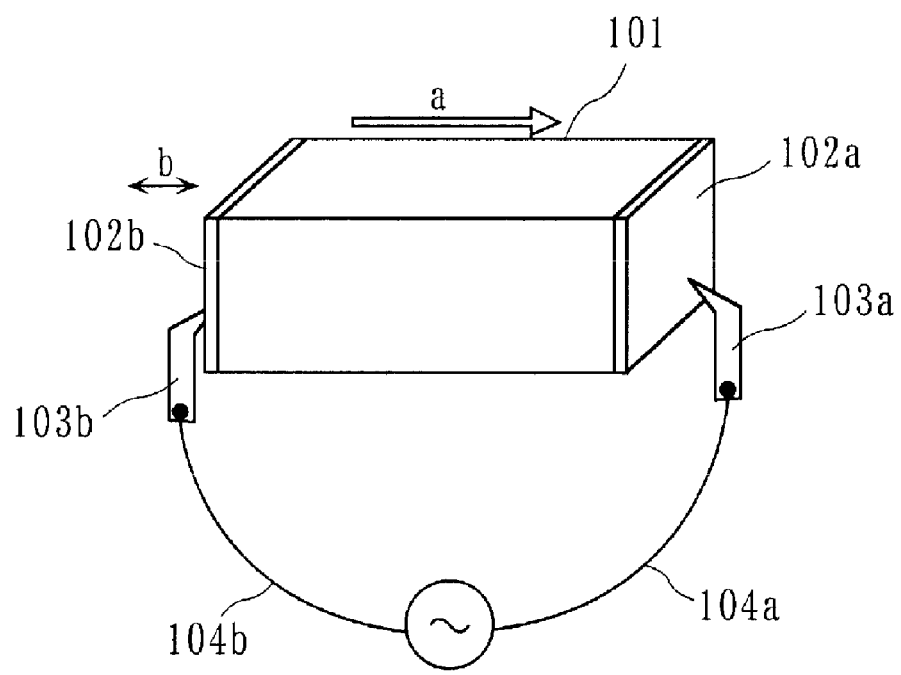
FIG. 12 is a perspective view showing a conventional example of a resonant actuator.

However, in the case in which the piezoelectric ceramic base member 1 is formed of a bismuth layer compound, it was found that when the electrode shape is formed as shown in FIG. 1, the mechanical quality factor Qm is increased as compared to that of the conventional electrode shape (FIG. 12). That is, since a bismuth layer compound has strong anisotropy, and the oscillation direction B and the polarization direction A are the same direction, a large mechanical quality factor Qm can be obtained without practically being influenced by the electric fields between the connection electrodes 3a and 3b facing each other and between the extraction conductors 4a and 4b.

Furthermore, since the widths of the extraction conductors 4a and 4b are formed smaller than the widths of the main electrodes 2a and 2b, respectively, the generation of the electric field in the arrow D direction can be further suppressed, and thereby a larger mechanical quality factor Qm can be obtained.

In addition, the crystal c axis of this bismuth layer compound is preferably oriented in a direction orthogonal to the polarization direction A of the ceramic base member 1.

Since this bismuth layer compound has strong anisotropy as described above, the mechanical quality factor Qm can be increased when the crystal c axis thereof is oriented in a direction orthogonal to the polarization direction A (oscillation direction B) of the ceramic base member 1.

Since the electrode shape as shown in FIG. 1 is formed, the oscillation can be prevented from being disturbed by mechanical factors, and hence a significantly larger mechanical quality factor Qm can be obtained.

As will be described in detail in the "Examples", the oriented bismuth layer compound can be easily formed by a TGG (Templated Grain Growth) method or the like. That is, the oriented bismuth layer compound can be easily formed, for example, when a ceramic molded body containing a c-axis oriented plate-shaped ceramic powder and a non-oriented calcined powder is formed, followed by performing a heat treatment.

In addition, since the mechanical quality factor Qm can be increased as described above, a high oscillation speed v can be obtained.

The relationship between the oscillation speed v and the mechanical quality factor Qm can be represented by equation (1).

$$v \propto C_E^{1/2} \cdot d \cdot Qm \cdot E \qquad (1)$$

In this equation, $C_E$ is the elastic stiffness coefficient.

As apparent from equation (1), the oscillation speed v is proportional to the product of the piezoelectric constant d and the mechanical quality factor Qm. Accordingly, although the piezoelectric constant d in the case of a bismuth layer compound is lower than that of a PZT-based piezoelectric ceramic material by approximately 1/10, the mechanical quality factor Qm can be increased; as a result, a high oscillation speed v can be obtained, and thereby a resonant actuator having a large amount of displacement can be obtained.

In addition, it was also found that even when a high electric field having a certain predetermined level or more is applied bismuth layer compound, the oscillation speed v is not destabilized and is increased approximately proportional to the applied electric field E. Accordingly, the resonant actuator can be stably driven even in a high electric field, and thereby a feedback circuit for controlling the resonant frequency fr and the oscillation speed v is not required.

The bismuth layer compound as described above is not particularly limited, and for example, $Bi_2SrNb_2O_9$, $BiWO_6$, $CaBiNb_2O_9$, $BaBiNb_2O_9$, $PbBi_2Nb_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_4Ti_4O_{15}$, $Ca_2Bi_4Ti_5O_{18}$, $Sr_2Bi_4Ti_5O_{18}$, $Ba_2Bi_4Ti_5O_{18}$, $Bi_6Ti_3WO_{18}$, $Bi_7Ti_4NbO_{21}$, and $Bi_{10}Ti_3W_3O_{30}$ may be used.

In the resonance actuator according to this embodiment, the piezoelectric ceramic base member 1 is formed of a bismuth layer compound, and the connection electrodes 3a and 3b are formed at the side-surface central portions orthogonal to the oscillation direction and are electrically connected to the main electrodes 2a and 2b through the extraction conductors 4a and 4b, respectively; hence, a large mechanical quality factor Qm can be obtained while the oscillation is not disturbed by mechanical factors, and a high oscillation speed v can be obtained even in a low electric field. Furthermore, since the oscillation speed v is changed approximately proportional to the applied electric field E ever a wide range of electric field intensity, the resonant actuator can be stably driven even in a high electric field. Therefore, a feedback circuit for controlling the resonant frequency fr and the oscillation speed v is not required, so that simplification of the device, cost reduction, and miniaturization can be achieved.

Since a larger mechanical quality factor Qm can be obtained, the calorific value can also be reduced, and a decrease in oscillation speed caused by heat can be prevented.

Although it has been difficult to use a conventional PZT-based piezoelectric ceramic at an oscillation speed v of more than 1 m/s, a bismuth layer compound can be stably used even at an oscillation speed v of more than 1 m/s, and the characteristics of a resonance actuator can be improved.

The present invention is not limited to the above embodiment. In the above embodiment, although the resonance actuator is driven at the resonant frequency fr, even when the resonant actuator is driven in a frequency range in the vicinity of the resonant frequency fr, that is, deviated therefrom by approximately several percentages points, the same effect as described above can also be obtained.

Next, Examples of the present invention will be particularly described.

EXAMPLE 1

Sample No. 1

Figure 4:
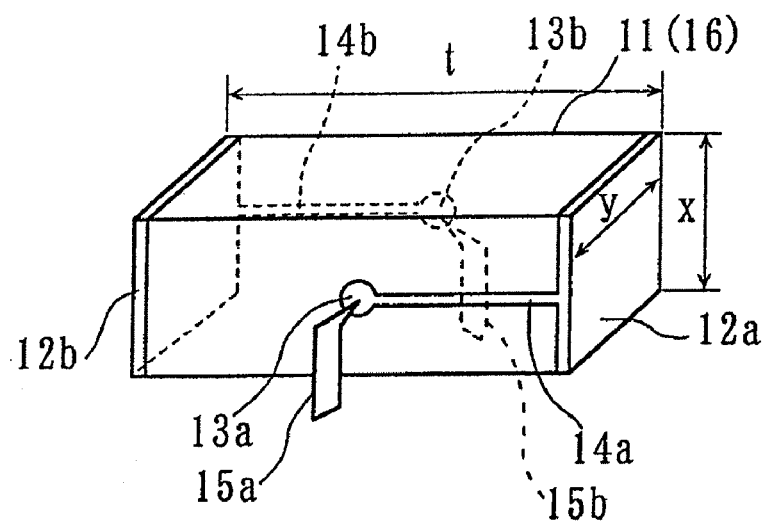
FIG. 4 is a perspective view showing the state in which a resonant actuator of each of Sample Nos. 1 and 4 is held by spring terminals.

A c-axis oriented $SrBi_2Nb_2O_9$ (hereinafter referred to as "SBN") based material was used as a bismuth layer compound, and a resonance actuator of Sample No. 1 having an electrode shape as shown in FIG. 4 was formed.

That is, as ceramic raw materials, $SrCO_3$, $Bi_2O_3$, $Nb_2O_5$, $Nd_2O_3$, and $MnCO_3$ were first prepared, the ceramic raw materials were then weighed so as to satisfy a final composition represented by the following composition formula, $\{100 (Sr_{0.9}Nd_{0.1}Bi_2Nb_2O_9)+MnO\}$, and the materials thus weighed were charged into a ball mill together with PSZ (Partially stabilized Zirconia) balls and water and were wet-mixed in the ball mill for approximately 16 hours, so that a mixture was obtained.

Next, the mixture thus obtained was dried and was then calcined at a temperature of 800° C. for 2 hours, so that a calcined powder was obtained.

After part of this calcined powder was recovered and then mixed with KCl at a weight ratio of 1:1, a heat treatment was performed at a temperature of 900° C. for 10 hours, followed by washing with water to remove the KCl, so that a ceramic powder was obtained.

The ceramic powder was observed using a scanning electron microscope, and it was confirmed that the ceramic powder had a shape of anisotropy, was oriented along the c axis, and had a plate shape having a ratio φ/H (aspect ratio) of the maximum height φ to height H of approximately 5.

Subsequently, this plate-shaped ceramic powder and the above calcined powder were mixed together at a weight ratio of 1:1, appropriate amounts of an organic binder, a dispersing agent, a defoaming agent, and a surfactant were further added thereto, and the mixture thus obtained was then charged into a ball mill together with PSZ balls and water and were wet-mixed in the ball mill for approximately 16 hours, so that a ceramic slurry was obtained. This ceramic slurry was then formed into oriented ceramic sheets having a thickness of approximately 60 μm using a doctor blade method.

Next, after a predetermined number of the oriented ceramic sheets were laminated to each other, a pressure bonding treatment was performed for 30 seconds under pressurized conditions at a temperature of 60° C. and at a pressure of 30 MPa, so that a laminate molded body was formed.

Subsequently, this laminate molded body was heated at a temperature of 350° C. for 5 hours and then further heated at a temperature of 500° C. for 2 hours to perform a debinder treatment, and firing was then performed at a temperature of 1,150° C. for 2 hours, so that a sintered block was formed. By this firing, plate-shaped ceramic particles functioning as a seed crystal (template) were homoepitaxially grown while incorporating the above calcined powder, so that an oriented sintered block was obtained (TGG method). In addition, a ceramic sintered body having a length of 10 mm, a width of 10 mm, and a thickness of 7 mm was obtained from the sintered block by cutting so that the crystal c axis was oriented in the orthogonal direction with respect to the plane having a length of 10 mm and a thickness of 7 mm, that is, so that the a-b plane faced in the thickness direction.

When the plane having a length of 10 mm and a thickness of 7 mm was analyzed using an x-ray diffraction method, and the degree of orientation was measured by a Lotgering method, the degree of orientation was 90%.

Next, a sputtering treatment was performed using Ag as a target to form main electrodes on two end surfaces in the thickness direction (oscillation direction), and a polarization treatment was performed in an oil having a bath temperature of 200° C. in the thickness direction by applying an electric field of 10.0 kV/mm for 30 minutes. In addition, the sample thus processed by the polarization treatment was cut into a size having a length (x) of 2 mm, a width (y) of 2 mm, and a thickness (t) of 7 mm by dicer cutting. As a result, a piezoelectric ceramic base member 11 of an SBN-based material and provided with main electrodes 12a and 12b formed on two end surfaces in the thickness direction was obtained, as shown in FIG. 4.

After a sputtering treatment was again performed using Ag as a target to form connection electrodes 13a and 13b at respective side-surface central portions, extraction conductors 14a and 14b electrically connecting the main electrodes 12a and 12b to the connection electrodes 13a and 13b, respectively, were further formed, so that the resonant actuator was obtained.

Next, resonance actuators of Sample Nos. 2 to 4 were formed as comparative examples.

Sample No. 2

Figure 5:
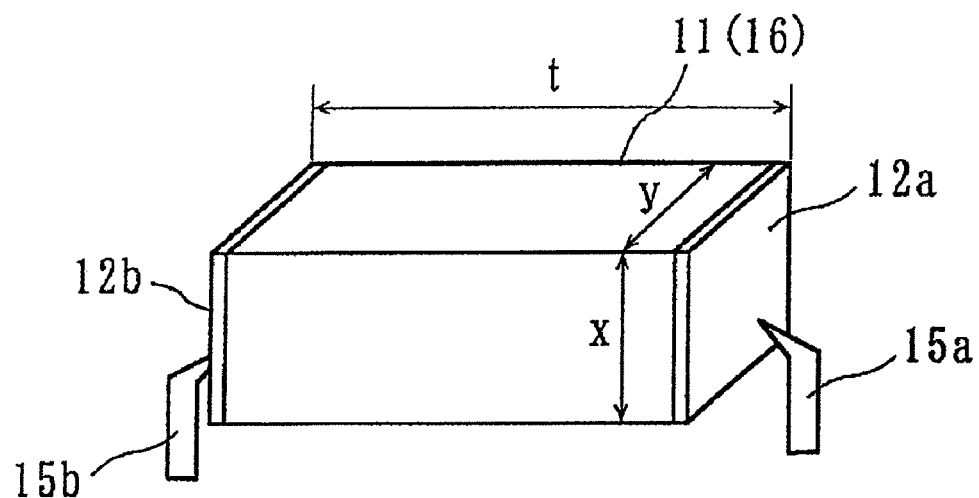
FIG. 5 is a perspective view showing the state in which a resonant actuator of each of Sample Nos. 2 and 3 is held by spring terminals.

In accordance with the same method and procedure as those of Sample No. 1, a resonant actuator was formed that had a length (x) of 2 mm, a width (y) of 2 mm, and a thickness (t) of 7 mm and that included the piezoelectric ceramic base member 11 formed of an SBN-based material and the main electrodes 12a and 12b formed on the two end surfaces thereof in the thickness direction, as shown in FIG. 5.

Sample No. 3

By using a PZT-based material, a resonance actuator as shown in FIG. 5 was formed.

That is, as ceramic raw materials, $Pb_3O_4$, $TiO_2$, $MnCO_3$, and $Nb_2O_5$ were first prepared, the ceramic raw materials were then weighed so as to satisfy a final composition represented by the following composition formula, $[Pb\{(Mn_{1/3}Nb_{2/3})_{0.10}Ti_{0.46}Zr_{0.44}\}O_3]$, and the materials thus weighed were charged into a ball mill together with PSZ balls and water and were then wet-mixed in the ball mill for approximately 16 hours, so that a mixture was obtained.

Next, the mixture thus obtained was dried and was then calcined at a temperature of 900° C. for 2 hours, so that a calcined powder was obtained.

Subsequently, appropriate amounts of an organic binder, a dispersing agent, a defoaming agent, and a surfactant were added to this calcined powder, and the mixture thus obtained was then charged into a ball mill together with PSZ balls and water and were wet-mixed in the ball mill for approximately 16 hours, so that a ceramic slurry was formed. This ceramic slurry was then formed into ceramic green sheets having a thickness of approximately 60 μm using a doctor blade method.

Next, after a predetermined number of the ceramic green sheets were laminated to each other, a pressure bonding treatment was performed for 30 seconds under pressurized conditions at a temperature of 60° C. and at a pressure of 30 MPa, so that a laminate molded body was formed.

After this laminate molded body was heated at a temperature of 350° C. for 5 hours and was further heated at a temperature of 500° C. for 2 hours to perform a debinder treatment, firing was then performed at a temperature of 1,200° C. for 2 hours to form a sintered block, and a ceramic sintered body having a length of 10 mm, a width of 10 mm, and a thickness of 7 mm was obtained therefrom by cutting.

Next, after a sputtering treatment was performed using Ag as a target to form main electrodes on two end surfaces, a polarization treatment was performed in an oil having a bath temperature of 200° C. in the thickness direction by applying an electric field of 10.0 kV/mm for 30 minutes. In addition, as with Sample No. 1, the sample thus processed by the polarization treatment was cut into a size having a length (x) of 2 mm, a width (y) of 2 mm, and a thickness (t) of 7 mm by dicer cutting. As a result, a resonant actuator was obtained that had a piezoelectric ceramic base member 16 formed of a PZT-based material and the main electrodes 12a and 12b formed on two end surfaces thereof, as shown in FIG. 5.

Sample No. 4

In accordance with the same method and procedure as those of Sample No. 3, the piezoelectric ceramic base member 16 was formed that was composed of a PZT-based material and that was provided with the main electrodes 12a and 12b on the two end surfaces in the thickness direction.

Subsequently, in accordance with the same method and procedure as those of Sample No. 1, the connection electrodes 13a and 13b and the extraction conductors 14a and 14b having the shapes as shown in FIG. 4 were formed, and as a result, a resonant actuator that had a length (x) of 2 mm, a width (y) of 2 mm, and a thickness (t) of 7 mm was formed.

Property Evaluation of Each Sample

In Sample Nos. 1 and 4, the connection electrodes 13a and 13b were held by spring terminals 15a and 15b, respectively (see FIG. 4), and in Sample Nos. 2 and 3, the main electrodes 12a and 12b were held by the spring terminals 15a and 15b, respectively (see FIG. 5). An electric field of 0.071 V/mm was applied to the resonant actuator through these spring terminals 15a and 15b, so that longitudinal oscillation was driven. In addition, the impedance and phase frequency characteristics were measured using an impedance analyzer (HP4294A manufactured by Agilent Technologies, Inc.), and the mechanical quality factor Qm was further obtained.

FIGS. 6 to 9 show the impedance and the phase frequency characteristics of Sample Nos. 1 to 4. The horizontal axis indicates the frequency (kHz), the left vertical axis indicates an impedance Z (kΩ), and the right horizontal axis indicates a phase angle θ (°). In these figures, the solid line indicates an impedance curve, the dotted line indicates a phase curve, and the dashed-two dotted line indicates a phase angle of 0°.

Table 1 shows the piezoelectric ceramic materials, electrode shapes, mechanical quality factors Qm, and frequency characteristics of Sample Nos. 1 to 4.

TABLE 1

Figure 6:
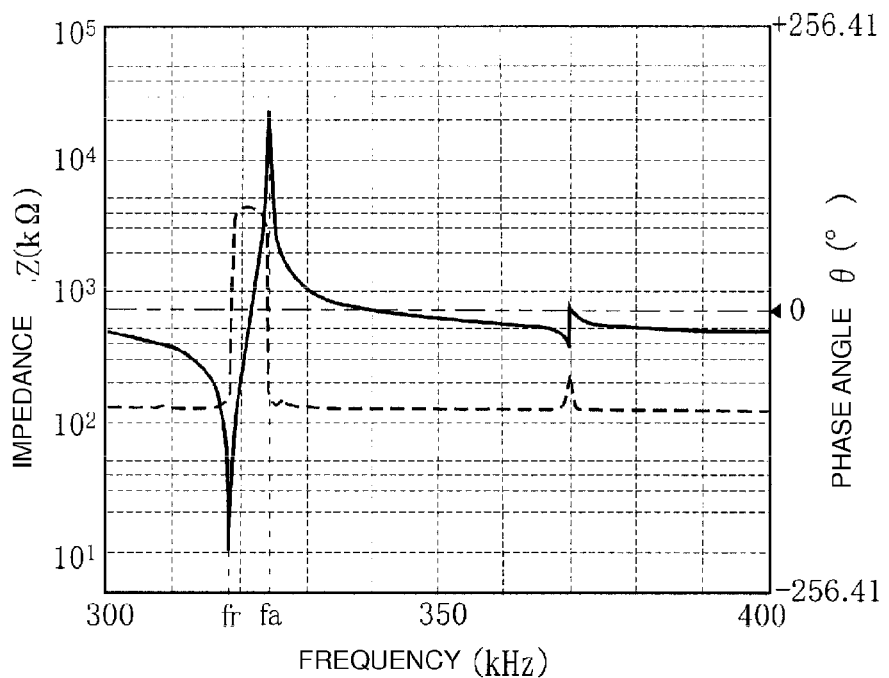
FIG. 6 is a view showing frequency characteristics of Sample No. 1.
Figure 7:
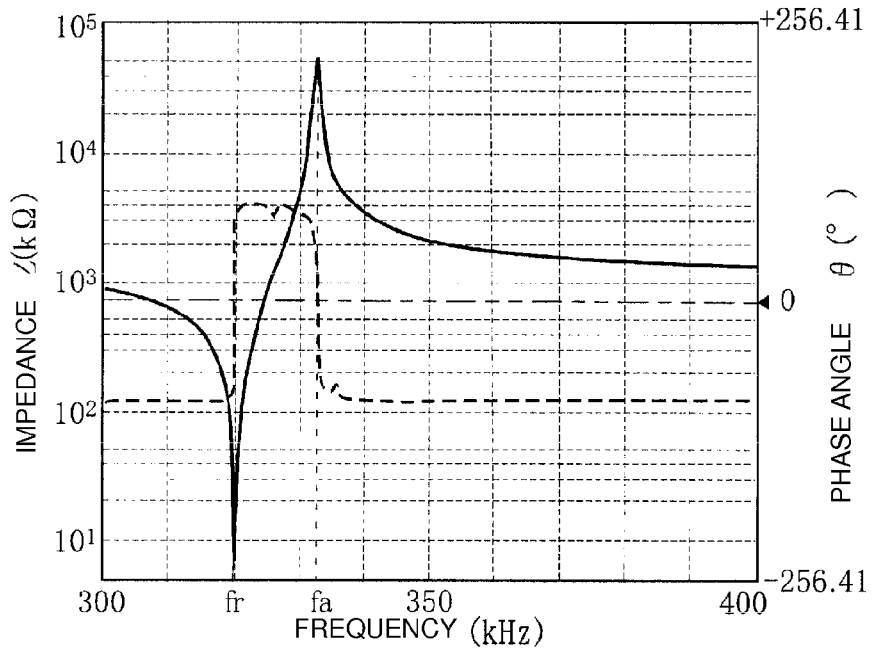
FIG. 7 is a view showing frequency characteristics of Sample No. 2.
Figure 8:
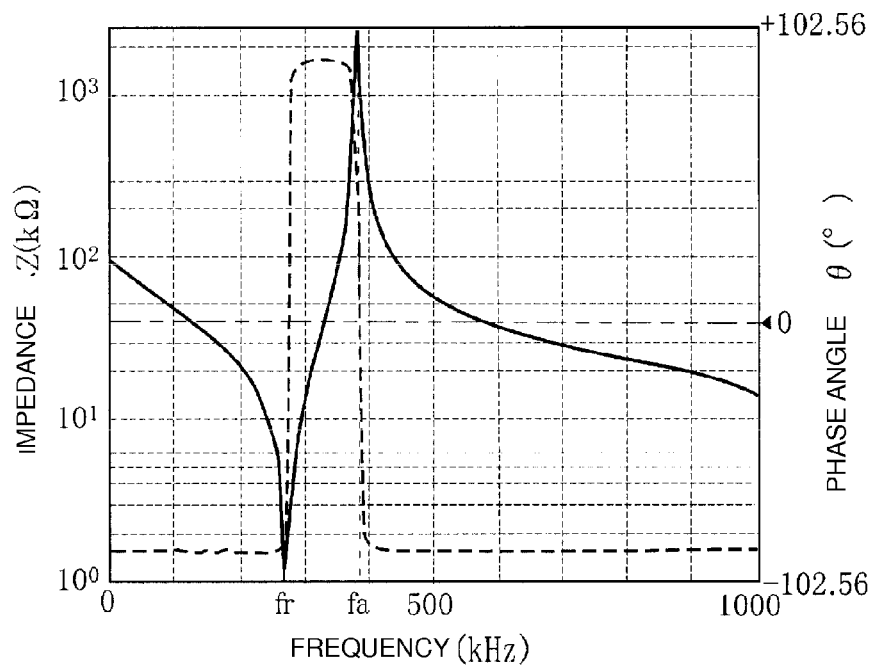
FIG. 8 is a view showing frequency characteristics of Sample No. 3.
Figure 9:
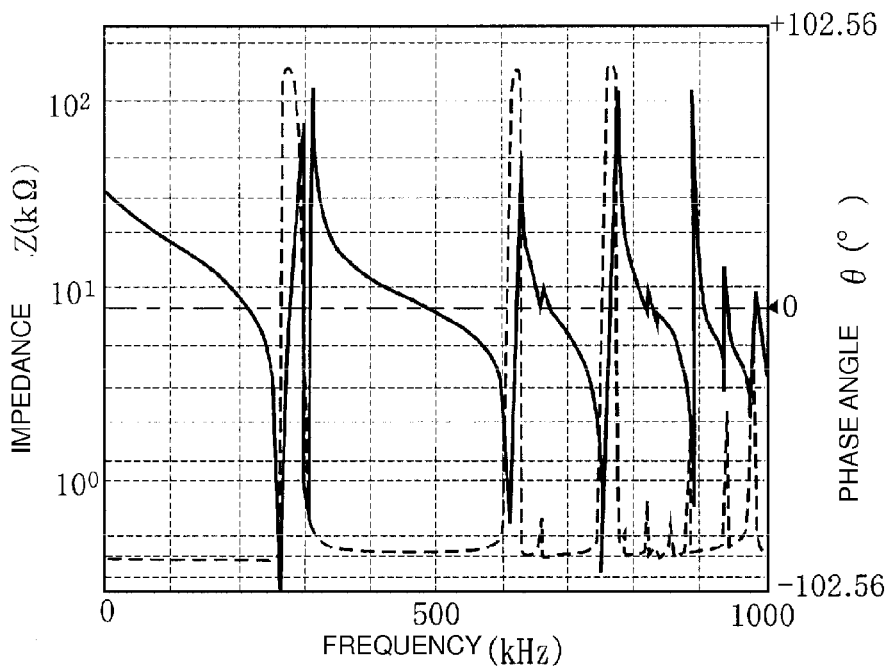
FIG. 9 is a view showing frequency characteristics of Sample No. 4.

| Sample No. | Piezoelectric Ceramic Material | Electrode Shape | Mechanical Quality Factor Qm (-) | Frequency Characteristics |
|---|---|---|---|---|
| 1 | SBN base | FIG. 4 | 6,000 | FIG. 6 |
| 2* | SBN base | FIG. 5 | 4,000 | FIG. 7 |
| 3* | PZT base | FIG. 5 | 1,100 | FIG. 8 |
| 4* | PZT base | FIG. 4 | 300 | FIG. 9 |

*indicates a comparative example (i.e., not the present invention).

When the frequency characteristics of Sample No. 2 (FIG. 7) are compared with those of Sample No. 3 (FIG. 8), although the phase at a resonant frequency fr and that at an antiresonant frequency fa are reversed to each other in both cases, the impedance curves of Sample No. 3 in the vicinities of the resonant frequency fr and the antiresonant frequency fa are inferior to those of Sample No. 2 in terms of steepness. In addition, as apparent from Table 1, although the mechanical quality factor Qm of Sample No. 3 is 1,100, the mechanical quality factor Qm of Sample No. 2 is 4,000; hence, it was found that an SBN-based material can obtain a large mechanical quality factor Qm as compared to that of a PZT-based material.

In addition, the mechanical quality factor Qm of Sample No. 4 is 300 and is extremely inferior to that of Sample No. 3, and it was also found that as shown in FIG. 9, the phase curve and the impedance curve both considerably fluctuate. The reason for this is believed that since a PZT-based material is used as the piezoelectric ceramic material, although the oscillation is not disturbed by mechanical factors when the electrode shape is formed as shown in FIG. 4, electric fields are generated between the connection electrodes 13a and 13b facing each other and between the extraction conductors 14a and 14b, the longitudinal oscillation in the thickness direction is disturbed thereby, and as a result, the mechanical quality factor Qm is decreased.

On the other hand, the mechanical quality factor Qm of Sample No. 1 is 6,000 and is improved as compared to that of Sample No. 2, and the frequency characteristics (FIG. 6) are also steeper in the vicinities of the resonant frequency fr the antiresonant frequency fa. That is, when the electrode shape is formed as shown in FIG. 4, and an SBN-based material is used for the piezoelectric ceramic base member 11, oscillation can be prevented from being disturbed by mechanical factors compared to the case in which the electrode shape is formed as shown in FIG. 5, and the influences of electric fields generated between the connection electrodes 13a and 13b facing each other and between the extraction conductors 14a and 14b can also be suppressed. Accordingly, it was found that a large mechanical quality factor Qm can be obtained, and that a high oscillation speed can be obtained in a low electric field.

EXAMPLE 2

By using the sample of Sample No. 1, the relationship between the applied electric field and the oscillation speed was investigated.

FIG. 10 is a schematic view of a measurement apparatus used in Example 2, and this apparatus has a laser radiation device 18 radiating laser light to Sample 17 and a laser Doppler oscillator 19 detecting the oscillation speed v.

After the connection electrodes 13a and 13b of Sample 17 were held by the spring terminals 15a and 15b, various voltages and alternating electric fields at a resonant frequency were applied to Sample 17, and the laser light was also radiated from the laser radiation device 18 to a central portion of the main electrode 12a, so that the oscillation speed v of Sample 17 was measured using the laser Doppler oscillator 19.

FIG. 11 is a view showing the relationship between the applied electric field E and the oscillation speed v, the horizontal axis indicates the applied electric field E (V/mm), and the vertical axis indicates the oscillation speed v (m/s).

As apparent from FIG. 11, it was found that the oscillation speed v is changed approximately proportional to the applied electric field E, and that when the applied electric field E is increased to approximately 14 V/mm, the oscillation speed is increased close to 4 m/s.

In a resonant actuator that uses a conventional PZT-based material, the oscillation speed is saturated at approximately 1 m/s (Non-Patent Document 1). However, it was confirmed that the oscillation speed of the resonant actuator according to the present invention is changed approximately proportional to the applied electric field E.

The invention claimed is:

1. A resonant actuator comprising a polarized body comprising a bar shaped ceramic base member; and a pair of main electrodes on opposing end surfaces of the ceramic base member in the polarization direction,
    wherein the ceramic base member comprises a bismuth layer compound, and
    a pair of connection electrodes and a pair of extraction electrodes, each connection electrode disposed at a central portion of a side-surface of the ceramic base member and electrically connected to one of the main electrodes with an extraction conductor interposed therebetween.

2. The resonant actuator according to claim 1, wherein the crystal c axis of the ceramic base member is oriented in a direction orthogonal to the polarization direction.

3. The resonant actuator according to claim 2, wherein each of the extraction conductors has a width which is smaller than the width of the connection electrode to which it is attached.

4. The resonant actuator according to claim 3, wherein bismuth layer is selected from the group consisting of $Bi_2SrNb_2O_9$, $BiWO_6$, $CaBiNb_2O_9$, $BaBiNb_2O_9$, $PbBi_2Nb_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_4Ti_4O_{15}$, $Ca_2Bi_4Ti_5O_{18}$, $Sr_2Bi_4Ti_5O_{18}$, $Ba_2Bi_4Ti_5O_{18}$, $Bi_6Ti_3WO_{18}$, $Bi_7Ti_4NbO_{21}$, and $Bi_{10}Ti_3W_3O_{30}$.

5. The resonant actuator according to claim 3, wherein bismuth layer is $SrBi_2Nb_2O_9$.

6. The resonant actuator according to claim 1, wherein each of the extraction conductors has a width which is smaller than the width of the connection electrode to which it is attached.

7. The resonant actuator according to claim 6, wherein bismuth layer is selected from the group consisting of $Bi_2SrNb_2O_9$, $BiWO_6$, $CaBiNb_2O_9$, $BaBiNb_2O_9$, $PbBi_2Nb_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_4Ti_4O_{15}$, $Ca_2Bi_4Ti_5O_{18}$, $Sr_2Bi_4Ti_5O_{18}$, $Ba_2Bi_4Ti_5O_{18}$, $Bi_6Ti_3WO_{18}$, $Bi_7Ti_4NbO_{21}$, and $Bi_{10}Ti_3W_3O_{30}$.

8. The resonant actuator according to claim 6, wherein bismuth layer is $SrBi_2Nb_2O_9$.

9. The resonant actuator according to claim 1, wherein bismuth layer is selected from the group consisting of $Bi_2SrNb_2O_9$, $BiWO_6$, $CaBiNb_2O_9$, $BaBiNb_2O_9$, $PbBi_2Nb_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_4Ti_4O_{15}$, $Ca_2Bi_4Ti_5O_{18}$, $Sr_2Bi_4Ti_5O_{18}$, $Ba_2Bi_4Ti_5O_{18}$, $Bi_6Ti_3WO_{18}$, $Bi_7Ti_4NbO_{21}$, and $Bi_{10}Ti_3W_3O_{30}$.

10. The resonant actuator according to claim 1, wherein bismuth layer is $SrBi_2Nb_2O_9$.

11. In a method of driving a polarized resonant actuator at about a resonant frequency, the improvement which comprises utilizing a resonant actuator of claim 10 as the resonant actuator and driving the actuator in an oscillation direction parallel to the polarization direction of the actuator.

12. In a method of driving a polarized resonant actuator at about a resonant frequency, the improvement which comprises utilizing a resonant actuator of claim 9 as the resonant actuator and driving the actuator in an oscillation direction parallel to the polarization direction of the actuator.

13. In a method of driving a polarized resonant actuator at about a resonant frequency, the improvement which comprises utilizing a resonant actuator of claim 8 as the resonant actuator and driving the actuator in an oscillation direction parallel to the polarization direction of the actuator.

14. In a method of driving a polarized resonant actuator at about a resonant frequency, the improvement which comprises utilizing a resonant actuator of claim 7 as the resonant actuator and driving the actuator in an oscillation direction parallel to the polarization direction of the actuator.

15. In a method of driving a polarized resonant actuator at about a resonant frequency, the improvement which comprises utilizing a resonant actuator of claim 6 as the resonant actuator and driving the actuator in an oscillation direction parallel to the polarization direction of the actuator.

16. In a method of driving a polarized resonant actuator at about a resonant frequency, the improvement which comprises utilizing a resonant actuator of claim 5 as the resonant lactuator and driving the actuator in an oscillation direction parallel to the polarization direction of the actuator.

17. In a method of driving a polarized resonant actuator at about a resonant frequency, the improvement which comprises utilizing a resonant actuator of claim 4 as the resonant actuator and driving the actuator in an oscillation direction parallel to the polarization direction of the actuator.

18. In a method of driving a polarized resonant actuator at about a resonant frequency, the improvement which comprises utilizing a resonant actuator of claim 3 as the resonant actuator and driving the actuator in an oscillation direction parallel to the polarization direction of the actuator.

19. In a method of driving a polarized resonant actuator at about a resonant frequency, the improvement which comprises utilizing a resonant actuator of claim 2 as the resonant actuator and driving the actuator in an oscillation direction parallel to the polarization direction of the actuator.

20. In a method of driving a polarized resonant actuator at about a resonant frequency, the improvement which comprises utilizing a resonant actuator of claim 1 as the resonant actuator and driving the actuator in an oscillation direction parallel to the polarization direction of the actuator.

\* \* \* \* \*